United States Patent
Takahashi

(10) Patent No.: US 6,198,327 B1
(45) Date of Patent: Mar. 6, 2001

(54) PULSE GENERATOR WITH IMPROVED HIGH SPEED PERFORMANCE FOR GENERATING A CONSTANT PULSE WIDTH

(75) Inventor: Hiroyuki Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/267,295

(22) Filed: Mar. 15, 1999

(30) Foreign Application Priority Data

Mar. 13, 1998 (JP) .................................................. 10-063774

(51) Int. Cl.$^7$ ....................................................... H03K 3/00
(52) U.S. Cl. ............................................. 327/291; 327/299
(58) Field of Search ................................... 327/291, 292, 327/293, 294, 299, 227

(56) References Cited

U.S. PATENT DOCUMENTS

| | | | |
|---|---|---|---|
| 5,097,148 | 3/1992 | Gabara | 326/27 |
| 5,444,407 | * 8/1995 | Ganapathy et al. | 327/295 |
| 5,726,596 | * 3/1998 | Perez | 327/292 |
| 5,977,810 | * 11/1999 | Shirata | 327/293 |

FOREIGN PATENT DOCUMENTS

| | | |
|---|---|---|
| 52-54358 | 5/1977 | (JP) . |
| 61-294682 | 12/1986 | (JP) . |
| 1-238310 | 9/1989 | (JP) . |
| 1-265315 | 10/1989 | (JP) . |
| 4-54721 | 2/1992 | (JP) . |
| 4-229714 | 8/1992 | (JP) . |
| 9-259586 | 10/1997 | (JP) . |

* cited by examiner

Primary Examiner—Toan Tran
Assistant Examiner—Linh Nguyen
(74) Attorney, Agent, or Firm—Hutchins, Wheeler & Dittmar

(57) ABSTRACT

ON-OFF operations of the pull-up and pull-down transistors are independently controlled so as to generate a start edge of a pulse signal in synchronizing with any one of a rising edge and a falling edge of a first cycle of the clock signal, and then generate an end edge of the pulse signal in synchronizing with any one of a rising edge and a falling edge of a later cycle than the first cycle, thereby avoiding concurrent ON-states of the pull-up and pull-down transistors, whereby the pulse generator is capable of generating the pulse signal completely depending upon a clock signal externally supplied but being independent from internal factors of the circuits thereby allowing a high speed and constant width pulse generation.

40 Claims, 9 Drawing Sheets

PULSE GENERATOR WITH IMPROVED HIGH SPEED PERFORMANCE FOR GENERATING A CONSTANT PULSE WIDTH

BACKGROUND OF THE INVENTION

The present invention relates to a pulse generator, and more particularly to a pulse generator for generating a basic pulse signal activating read/write internal operations of a synchronous semiconductor memory device wherein an internal access is made by utilizing two or more clock cycles as a cycle unit.

A conventional pulse signal generator has a circuit configuration as illustrated in FIG. 1. This conventional pulse signal generator has the following disadvantage. A pulse signal generation timing is largely delayed from input of the clock signal CLK. The conventional circuit configuration is such that a short pulse signal "B" is once generated in accordance with a logic signal "A" based upon the clock signal and the action commence signal "AC". This means it necessary to form three logic gate stages. This short pulse generation circuit is necessary. If no short pulse generation circuit is provided, the following problems will appear. If the high level time period of the clock signal CLK is short, a reset appear due to the low level of the clock signal CLK on the delay circuit which defines the pulse width of the next stage, whereby the pulse signal may be discontinued.

The conventional pulse signal generator of FIG. 1 has a further disadvantage as follows. A pulse width is variable depending upon variations on characteristics of the transistors due to variations in environmental conditions such as temperature and power voltage level as well as due to variations in manufacturing conditions. The conventional circuit configuration is such that the pulse width is defined by a total time of first and second delay times respectively provided by first and second delay circuits 26 and 27. This circuit normally comprises series connections of plural stages of invertors. This delay time is just influenced by variations of the capability of the MOS transistors in the invertors.

In the above circumstances, it had been required to develop a novel pulse generator free from the above problems and generating a basic pulse signal activating read/write internal operations of a synchronous semiconductor memory device wherein an internal access is made by utilizing two or more clock cycles as a cycle unit.

SUMMARY OF THE INVENTION

Accordingly, it is an object of the present invention to provide a novel pulse generator free from the above problems.

It is a further object of the present invention to provide a novel pulse generator generating a high speed pulse.

It is a still further object of the present invention to provide a novel pulse generator capable of high speed generation of a pulse signal within a short time from input of a clock signal.

It is yet a further object of the present invention to provide a novel pulse generator capable of a pulse signal having a constant pulse width free of any variation depending upon environmental conditions such as temperature and power voltage level.

It is a further more object of the present invention to provide a novel pulse generator capable of a pulse signal having a constant pulse width free of any variation depending upon variation in characteristics of transistors due to variations of manufacturing conditions.

It is still more object of the present invention to provide a novel pulse generator capable of a pulse signal having a constant pulse width entirely depending upon a clock cycle time.

It is moreover object of the present invention to provide a novel pulse generator operable to avoid concurrent ON-states of pull-up and pull-down transistors.

It is another object of the present invention to provide a novel pulse generator capable of a pulse signal having a constant pulse width entirely depending upon a predetermined time period counted fron a pulse rising edge in synchronizing with a clock signal utilizing plural clock cycles as a cycle unit.

It is still another object of the present invention to provide a novel pulse generator capable of a pulse signal having a constant pulse width by taking a timing of a pulse falling-edge defined by a delay from a pulse rising-edge.

It is yet another object of the present invention to provide a synchronous semiconductor memory device showing reading and writing operations activated by a pulse signal generated by a novel pulse generator free from the above problems.

It is further another object of the present invention to provide a synchronous semiconductor memory device showing reading and writing operations activated by a pulse signal generated by a novel pulse generator generating a high speed pulse.

It is an additional object of the present invention to provide a synchronous semiconductor memory device showing reading and writing operations activated by a pulse signal generated by a novel pulse generator capable of high speed generation of a pulse signal within a short time from input of a clock signal.

It is a still additional object of the present invention to provide a synchronous semiconductor memory device showing reading and writing operations activated by a pulse signal generated by a novel pulse generator capable of a pulse signal having a constant pulse width free of any variation depending upon environmental conditions such as temperature and power voltage level.

It is yet an additional object of the present invention to provide a synchronous semiconductor memory device showing reading and writing operations activated by a pulse signal generated by a novel pulse generator capable of a pulse signal having a constant pulse width free of any variation depending upon variation in characteristics of transistors due to variations of manufacturing conditions.

It is a further additional object of the present invention to provide a synchronous semiconductor memory device showing reading and writing operations activated by a pulse signal generated by a novel pulse generator capable of a pulse signal having a constant pulse width entirely depending upon a clock cycle time.

It is also additional object of the present invention to provide a synchronous semiconductor memory device showing reading and writing operations activated by a pulse signal generated by a novel pulse generator operable to avoid concurrent ON-states of pull-up and pull-down transistors.

It is also additional object of the present invention to provide a synchronous semiconductor memory device showing reading and writing operations activated by a pulse signal generated by a novel pulse generator capable of a pulse signal having a constant pulse width entirely depending upon a predetermined time period counted from a pulse rising edge in synchronizing with a clock signal utilizing plural clock cycles as a cycle unit.

It is also additional object of the present invention to provide a synchronous semiconductor memory device showing reading and writing operations activated by a pulse signal generated by a novel pulse generator capable of a pulse signal having a constant pulse width by taking a timing of a pulse falling-edge defined by a delay from a pulse rising-edge.

In accordance with the present invention, ON-OFF operations of the pull-up and pull-down transistors are independently controlled so as to generate a start edge of a pulse signal in synchronizing with any one of a rising edge and a falling edge of a first cycle of the clock signal, and then generate an end edge of the pulse signal in synchronizing with any one of a rising edge and a falling edge of a later cycle than the first cycle, thereby avoiding concurrent ON-states of the pull-up and pull-down transistors, whereby the pulse generator is capable of generating the pulse signal completely depending upon a clock signal externally supplied but being independent from internal factors of the circuits. This allows a high speed and constant width pulse generation.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
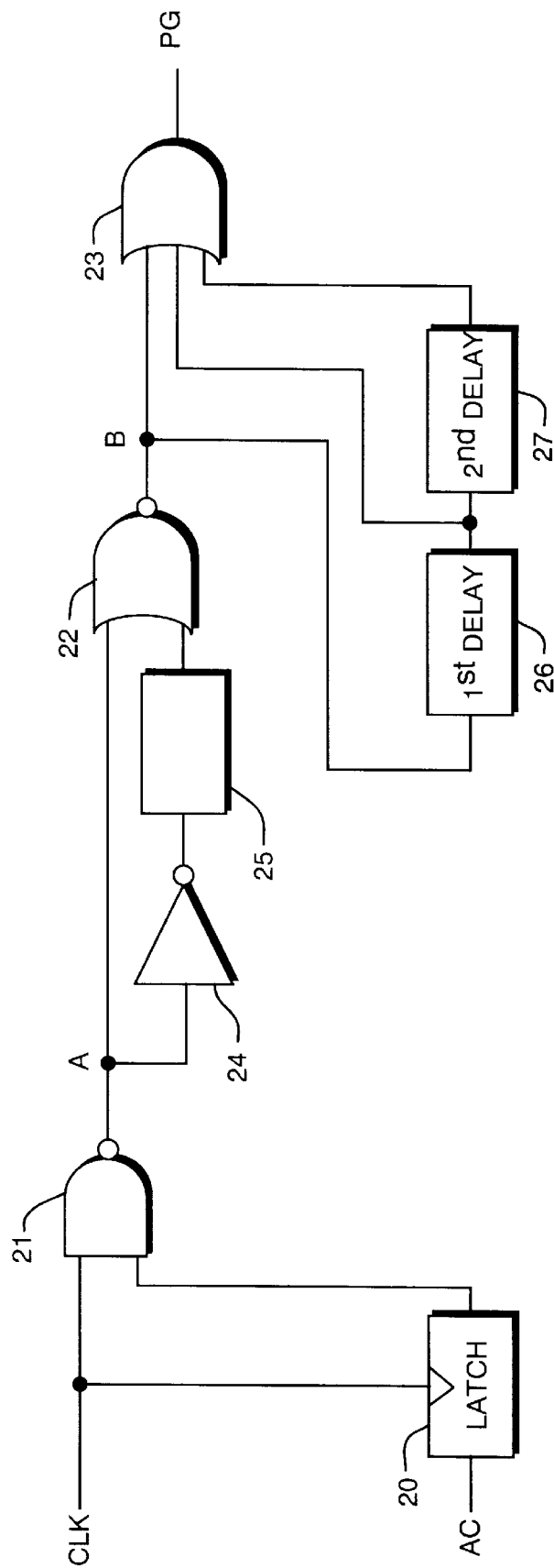
FIG. 1 is a circuit diagram illustrative of a conventional pulse generator.
Figure 2:
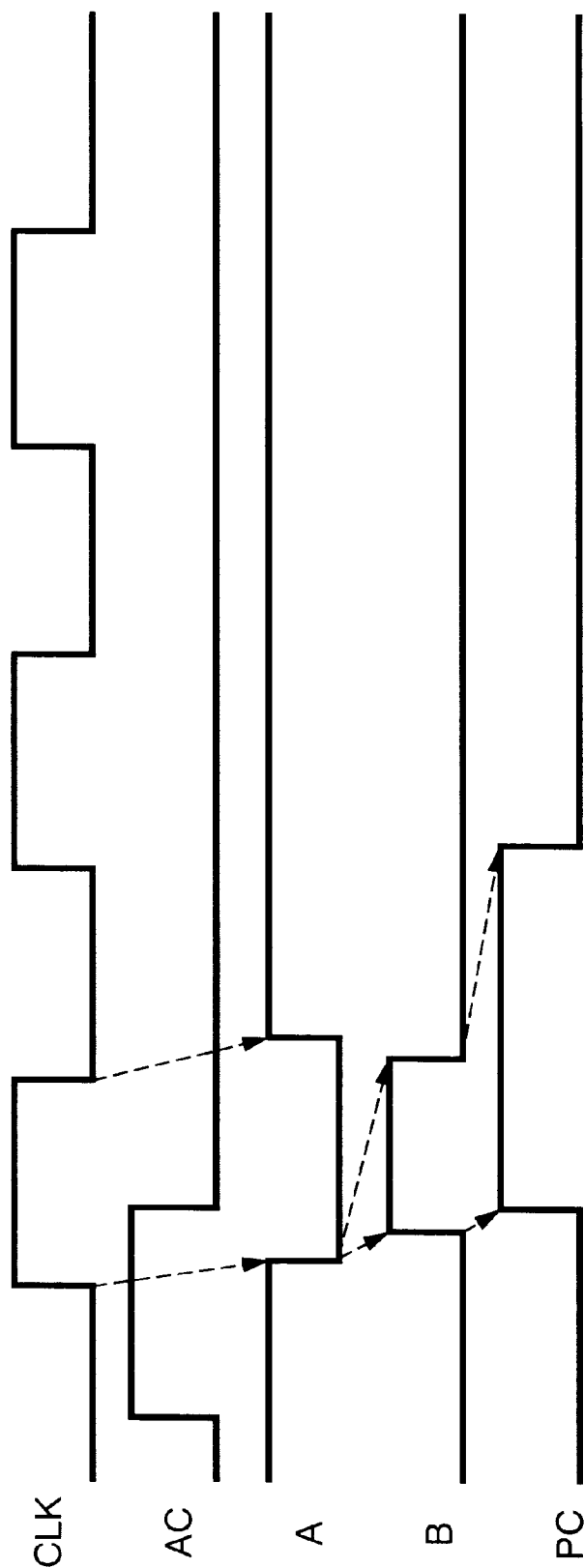
FIG. 2 is a timing chart illustrative of waveforms of signals of a pulse generator of FIG. 1.

The first present invention provides a pulse signal generator comprising: a series connection of a pull-up transistor and a pull-down transistor between a high voltage line and a low voltage line; and a logic circuit having a first input terminal for receiving a clock signal utilizing plural clock cycles as a cycle unit, the logic circuit having first and second output terminals connected to gates of the pull-up and pull-down transistors for outputting first and second output logic signals from the first and second output terminals and inputting the first and second output logic signals into the gates of the pull-up and pull-down transistors respectively, wherein the logic circuit controls ON-OFF operations of the pull-up and pull-down transistors independently, so that the pulse generator generates a start edge of a pulse signal in synchronizing with any one of a rising edge and falling edge of a first cycle of the clock signal, and then the pulse generator generates an end edge of the pulse signal in synchronizing with any one of a rising edge and a falling edge of a later cycle than the first cycle.

The second present invention provides a pulse signal generator comprising: a series connection of a pull-up transistor and a pull-down transistor between a high voltage line and a low voltage line; and a logic circuit having a first input terminal for receiving a clock signal utilizing plural clock cycles as a cycle unit, the logic circuit having first and second output terminals connected to gates of the pull-up and pull-down transistors for outputting first and second output logic signals from the first and second output terminals and inputting the first and second output logic signals into the gates of the pull-up and pull-down transistors respectively, wherein the logic circuit controls ON-OFF operations of the pull-up and pull-down transistors independently, so that the pulse generator generates a start edge of a pulse signal in synchronizing with a high level of a first cycle of the clock signal, and then the pulse generator generates an end edge of the pulse signal in synchronizing with a high level of a later cycle than the first cycle.

It is preferable that the later cycle than the first cycle is a second cycle.

It is further preferable that the logic circuit controls the pull-up and pull-down transistors so that the pull-up transistor turns ON in synchronizing with any one, of the rising, edge and the falling edge of the first cycle and then turns OFF in synchronizing with another of the rising edge and the falling, edge of the first cycle, before the pull-down transistor turns ON in synchronizing with any one of a rising edge and a falling edge of the second cycle.

It is also preferable that the logic circuit controls the pull-up and pull-down transistors so that the pull-down transistor turns ON in synchronizing with any one of the rising edge and the falling edge of the first cycle and then turns OFF in synchronizing with another of the rising edge and the falling edge of the first cycle, before the pull-up transistor turns ON in synchronizing with any one of the rising edge and the falling edge of the second cycle.

It is also preferable that the logic circuit comprises: a latch circuit for receiving the clock signal and an action commence signal and outputting a latch circuit output signal; a NAND circuit having a first input terminal for receiving the clock signal and a second input termninal for receiving the latch circuit output signal and having a first output terminal connected to the gate of the pull-up transistor; an n-channel field effect transistor connected in series between the gate of the pull-down transistor and the low voltage line and the n-channel field effect transistor having a gate receiving the latch circuit output signal; and a p-channel field effect transistor connected in series between the first input terminal of the logic circuit and the gate of the pull-down transistor, and the p-channel field effect transistor having a gate receiving the latch circuit output signal.

It is also preferable that the logic circuit further compresses an invertor connected to an input side of the latch circuit for inputting the action commence signal through the invertor to the latch circuit.

It is also preferable that the logic circuit comprises: a latch circuit for receiving the clock signal and an action commence signal and outputting a latch circuit output signal; a NOR circuit having a first input terminal for receiving the clock signal and a second input terminal for receiving the latch circuit output signal and having a first output terminal connected to the gate of the pull-down transistor; a p-channel field effect transistor connected in series between the gate of the pull-up transistor and the high voltage line and the p-channel field effect transistor having a gate receiving the latch circuit output signal; and an n-channel field effect transistor connected in series between the first input terminal of the logic circuit and the gate of the pull-up transistor, and the n-channel field effect transistor having a gate receiving the latch circuit output signal.

It is preferable to further comprise an invertor circuit connected to an output point positioned intermediate between the pull-up and pull-down transistors for holding an output from the output point when the pull-up and pull-down transistors are in OFF states.

It is also preferable that the logic circuit includes a transfer circuit.

In the synchronous semiconductor memory device operable in synchronizing with a clock signal utilizing plural clock cycles as a cycle unit, the synchronous semiconductor memory device has a pulse signal generator described above.

The third present invention provides a pulse signal generator comprising: a series connection of a pull-up transistor and a pull-down transistor between a high voltage line and a low voltage line, and the pull-up and pull-down transistors being connected to an output terminal of the pulse signal generator; a logic circuit having a first input terminal for receiving a clock signal, the logic circuit having first and second output terminals connected to gates of the pull-up and pull-down transistors for outputting first and second output logic signals from the first and second output terminals and inputting the first and second output logic signals into the gates of the pull-up and pull-down transistors respectively; and a pulse signal end edge control circuit connected to the output terminal of the pulse signal generator and also connected to the logic circuit, wherein the logic circuit controls ON-OFF operations of the pull-up transistor, so that the pulse generator generates a start edge of the pulse signal in synchronizing with any one of the rising edge and the falling edge of the clock signal, and wherein the pulse signal end edge control circuit controls ON-OFF operations of the pull-down transistor, so that the pulse generator generates an end edge of the pulse signal at a timing delayed by a predetermined time period from the start edge of the pulse signal.

The fourth present invention provides a pulse signal generator comprising: a series connection of a pull-up transistor and a pull-down transistor between a high voltage line and a low voltage line, and the pull-up and pull-down transistors being connected to an output terminal of the pulse signal generator; a logic circuit having a first input terminal for receiving a clock signal, the logic circuit having first and second output terminals connected to gates of the pull-up and pull-down transistors for outputting first and second output logic signals from the first and second output terminals and inputting the first and second output logic signals into the gates of the pull-up and pull-down transistors respectively; and a pulse signal end edge control circuit connected to the output terminal of the pulse signal generator and also connected to the logic circuit, wherein the logic circuit controls ON-OFF operations of the pull-up transistor, so that the pulse generator generates a start edge of the pulse signal in synchronizing with a high level of the clock signal, and wherein the pulse signal end edge control circuit controls ON-OFF operations of the pull-down transistor, so that the pulse generator generates an end edge of the pulse signal at a timing delayed by a predetermined time period from the start edge of the pulse signal.

It is preferable that the pulse signal end edge control circuit includes at least a delay circuit and at least a logic gate.

It is further preferable that the pulse signal end edge control circuit comprises: a first delay circuit having an input side connected to the output terminal of the pulse signal generator; a first invertor having an input side connected to an output side of the first delay circuit; a second delay circuit having an input side connected to an output side of the first invertor; a NAND circuit having a first input terminal connected to the output side of the first delay circuit and a second input terminal connected to an output side of the second delay circuit; and an n-channel field effect transistor connected in series between the output terminal of the pulse signal generator and a low voltage line, and the n-channel field effect transistor having a gate connected to an output terminal of the NAND circuit for receiving an output logic signal from the NAND circuit.

It is also preferable to further comprise a latch circuit for receiving the clock signal and an action commence signal, the latch circuit connected to the gate of the n-channel field effect transistor for receiving an output signal from the pulse signal end edge control circuit, and the latch circuit further connected to the logic circuit.

It is also preferable that the latch circuit comprises: a NAND circuit having a first input terminal connected to the gate of the n-channel field effect transistor of the pulse signal end edge control circuit and a second input terminal connected to the logic circuit; a second invertor having an input terminal connected to an output terminal of the NAND circuit of the latch circuit and an output terminal connected to the logic gate; and a p-channel field effect transistor connected in series between the logic terminal and an action commence signal terminal to which the action commence signal is inputted, and the p-channel field effect transistor having a gate for receiving the clock signal.

It is also preferable that the logic circuit comprises: a latch circuit for receiving the clock signal and an action commence signal and outputting a latch circuit output signal; a NAND circuit having a first input terminal for receiving the clock signal and a second input terminal for receiving the latch circuit output signal and having a first output terminal connected to the gate of the pull-up transistor; an n-channel field effect transistor connected in series between the gate of the pull-down transistor and the low voltage line and the n-channel field effect transistor having a gate receiving the latch circuit output signal; and a p-channel field effect transistor connected in series between the first input terminal of the logic circuit and the gate of the pull-down transistor, and the p-channel field effect transistor having a gate receiving the latch circuit output signal.

It is also preferable that the logic circuit further compresses an invertor connected to an input side of the latch circuit for inputting the action commence signal through the invertor to the latch circuit.

It is also preferable that the logic circuit comprises: a latch circuit for receiving the clock signal and an action commence signal and outputting a latch circuit output signal; a NOR circuit having a first input terminal for receiving the clock signal and a second input terminal for receiving the latch circuit output signal and having a first output terminal connected to the gate of the pull-down transistor; a p-channel field effect transistor connected in series between the gate of the pull-up transistor and the high voltage line and the p-channel field effect transistor having a gate receiving the latch circuit output signal; and an n-channel field effect transistor connected in series between the first input terminal of the logic circuit and the gate of the pull-up transistor, and the n-channel field effect transistor having a gate recciving the latch circuit output signal.

It is also preferable that the logic circuit includes a transfer circuit.

In a synchronous semiconductor memory device operable in synchronizing with a clock signal, the synchronous semiconductor memory device has a pulse signal generator as described above.

In accordance with the above first to fourth present inventions, the pulse signal generated by the above novel pulse generator is to be used for activation of read and write operations of the semiconductor memory device, for which reason the pulse signal is required to have a high frequency and a constant width.

The first and second present inventions are to provide the pulse generator utilizing two or more cycles of the clock signals as a cycle unit. This corresponds to a case of realizing synchronizing circuits of latency 2 or more, or a burst circuit in pre-fetch operations.

The pulse generator has a driver section having a series connection of pull-up and pull-down transistors between a high voltage line such as a power voltage line and a low voltage line such as a ground line. The pull-up transistor is connected to the high voltage line such as the power voltage line. The pull-up transistor may comprise a p-channel MOS field effect transistor. The pull-down transistor is connected to the low voltage line such as the ground line. The pull-up transistor may comprise an n-channel MOS field effect transistor. The following descriptions will be made in the case that two cycles, for example, first and second cycles are utilized as a clock cycle unit for operations of the pulse generator.

The logic circuit controls ON-OFF operations of the pull-up and pull-down transistors independently. The logic circuit makes the pull-up transistor turn ON in synchronizing with a high pulse or a rising edge of the first cycle of the clock signal, whereby the pulse generator generates a start edge of a basic pulse PG. The logic circuit also makes the pull-down transistor turn ON in synchronizing with a low pulse or a rising edge of the second cycle of the clock signal, whereby the pulse generator generates an end edge of the basic pulse PG. The pulse generator has an invertor circuit which is connected to an output terminal from which the basic pulse PG is outputted. The output terminal is also connected to an intermediate point between the pull-up and pull-down transistors. After any one of the pull-up and pull-down transistors has turned ON, then the invertor circuit is capable of holding high or low level potential. This circuit configuration allows a high speed generation of a pulse signal which has a constant width entirely defined by a cycle time.

The above novel pulse generator has two stages, wherein the first stage has the logic circuit for controlling the ON-OFF operations of the pull-up and pull-down transistors, whilst the second stage has the series connection of the pull-up and pull-down transistors between the high voltage line such as the power voltage line and the low voltage line such as the ground line. The series connection of the pull-up and pull-down transistors is of the invertor configuration for allowing high performances of the transistors. The pulse generator has no series connection of p-channel and n-channel transistors between input and output terminals as in NAND and NOR gates.

The logic circuit controls independently ON-operations of the p-channel MOS field effect transistor as the pull-up transistor and the n-channel MOS field effect transistor as the pull-down transistor. This independent control of the ON-operations of the p-channel and n-channel MOS field effect transistors results in no capability ratio between transistors concurrently turning OFF, thereby allowing high peed output response. This means it possible for the above novel pulse generator to generate the high speed pulse.

The pulse start is defined by a high edge or rising edge of the first cycle of the clock signals, whilst the pulse end is defined by a high edge or rising edge of the second cycle of the clock signals. This means that the pulse width entirely depends upon the cycle time of the clock signals externally supplied. The externally supplied clock signal is the most stable signal to be supplied to the synchronous circuit. The clock signal remains constant over variations in external conditions. The pulse generator operation is exactly synchronizing with the externally supplied clock signals, for which reason the operations of the pulse generator is free from any influences due to the variations in manufacturing conditions.

The ON-time of the pull-up and pull-down transistors in the driver section is decided by the high pulse time period of the clock signals. It is sufficient that the ON-time extends only the time of variation in potential or voltage of the basic pulse signal. Since the time of variation in potential or voltage of the basic pulse signal is extremely short, then it is sufficient that the ON-time of the pull-up and pull-down transistors is extremely short, for example, 0.5 nanoseconds or less. The low pulse time period of the clock signal means the time period when both the p-channel and n-channel MOS field effect transistors as the pull-up and pull-down transistors are in OFF states. It is, therefore, sufficient that the OFF-time extends only the time of variation in potential or voltage of the basic pulse signal. Since the time of variation in potential or voltage of the basic pulse signal is extremely short, then it is sufficient that the OFF-time of the pull-up and pull-down transistors is also extremely short. Both ON-time and OFF time are not relevant to the pulse width, for which reason there is extremely small influence of minimization of high or low time period.

Accordingly, the novel pulse generator is free from the above problems. The novel pulse generator is capable of generating a high speed pulse. The novel pulse generator is also capable of high speed generation of a pulse signal within a short time from input of a clock signal. The novel pulse generator is also capable of a pulse signal having a constant pulse width free of any variation depending upon environmental conditions such as temperature and power voltage level. The novel pulse generator is also capable of a pulse signal having a constant pulse width free of any variation depending upon variation in characteristics of transistors due to variations of manufacturing conditions. The novel pulse generator is also capable of a pulse signal having a constant pulse width entirely depending upon a clock cycle time. The novel pulse generator is operable to avoid concurrent ON-states of pull-up and pull-down transistors. The novel pulse generator is capable of a pulse signal having a constant pulse width entirely depending upon a predetermined time period counted from a pulse rising edge in synchronizing with a clock signal utilizing plural clock cycles as a cycle unit. The novel pulse generator is capable of a pulse signal having a constant pulse width by taking a timing of a pulse falling-edge defined by a delay from a pulse rising-edge. For the above reasons, the synchronous semiconductor memory device can show reading and writing operations activated by a pulse signal generated by the novel pulse generator free from the above problems.

Figure 3:
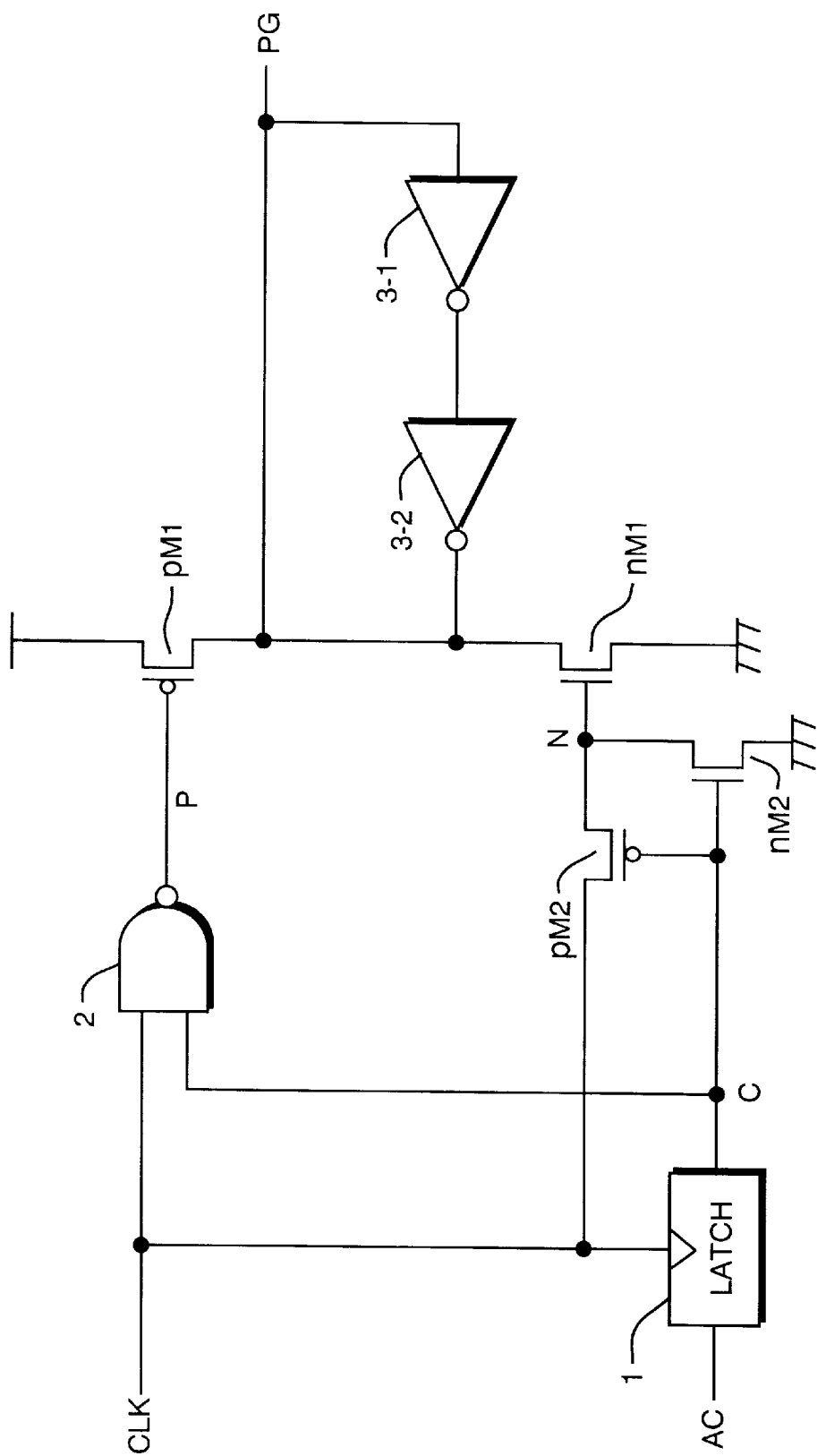
FIG. 3 is a circuit diagram illustrative of a novel pulse generator of a first embodiment in accordance with the present invention.
Figure 4:
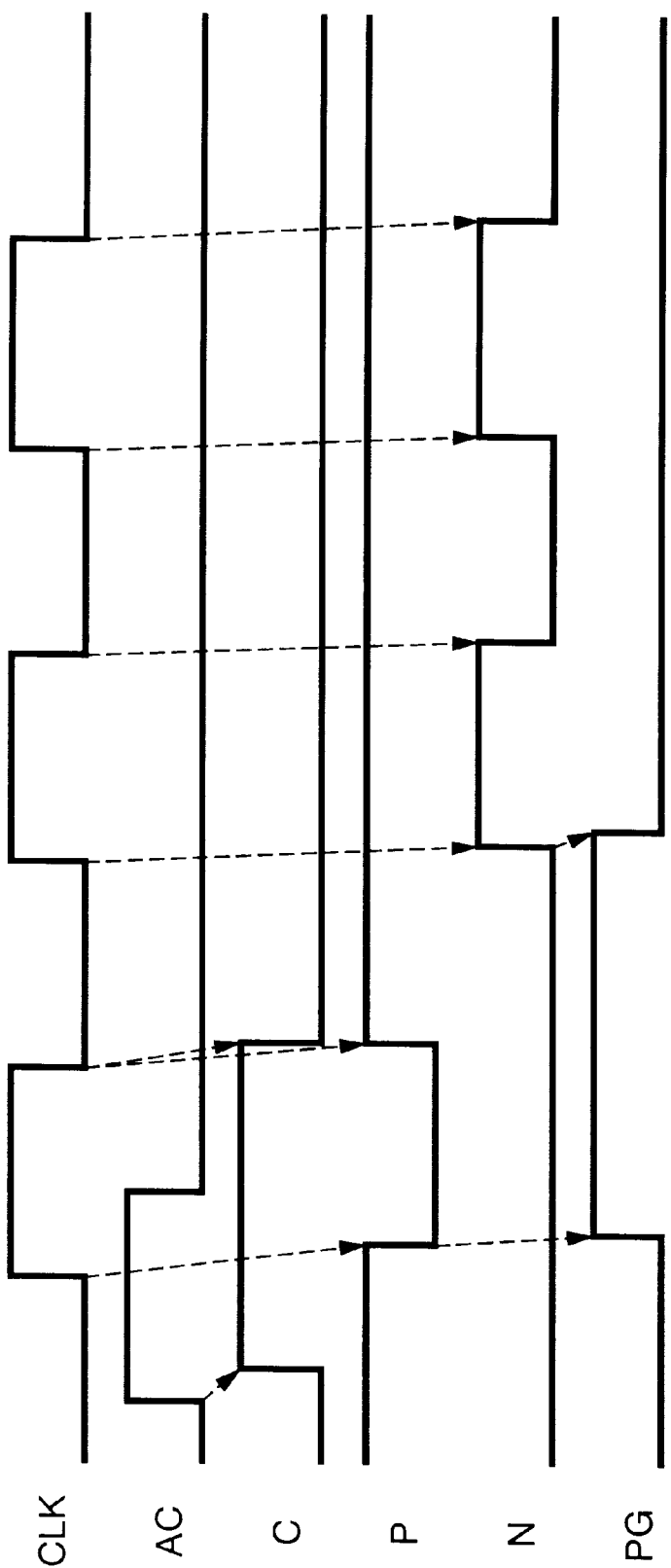
FIG. 4 is a timing chart illustrative of waveforms of signals of a pulse generator of FIG. 3.

A first embodiment according to the present invention will be described in detail with reference to FIGS. 3 and 4. The circuit configuration of the pulse generator will be described with reference to FIG. 3. The pulse generator has a first stage having a logic circuit and a second stage having a series connection of pull-up and pull-down transistors between a power voltage line and a ground voltage line. The pull-up transistor comprises a p-channel MOS field effect transistor PM1 connected to the power voltage line. The pull-down transistor comprises an n-channel MOS field effect transistor NM1 connected to the ground voltage line. An intermediate point between the p-channel MOS field effect transistor PM1 and the n-channel MOS field effect transistor NM1 is connected to an output terminal from which a pulse signal PG is outputted. An invertor circuit is further provided between the output terminal and the intermediate point between the p-channel MOS field effect transistor PM1 and the n-channel MOS field effect transistor NM1. The invertor circuit comprises a series connection of a first invertor 3-1 and a second invertor 3-2. The first stage has a latch circuit 1 and a logic circuit.

The latch circuit 1 receives inputs of a clock signal CLK and an action commence signal AC. The latch circuit 1 outputs an output signal "C", wherein the output signal "C" is risen up when the action commence signal AC becomes high level as a burst commence signal, whilst the output signal "C" is fallen down by falling edge of the clock signal CLK. The latch circuit 1 generates the output signal "C" which is the signal obtained by expanding the high level period of the action commence signal AC as the burst commence signal to the low edge or falling edge of the clock signal CLK.

The logic circuit comprises a NAND gate 2 and a p-channel MOS field effect transistor PM2 and an n-channel MOS field effect transistor NM2. The NAND gate 2 has a first input terminal for receiving the clock signal CLK and a second terminal connected to an output terminal of the latch circuit 1 for receiving the output signal "C" from the latch circuit 1. The NAND gate 2 has an output terminal connected to a gate of the p-channel MOS field effect transistor PM1 as the pull-up transistor for sending an output signal "P" as a first gate control signal to the gate of the p-channel MOS field effect transistor PM1. The p-channel MOS field effect transistor PM2 is connected in series between a clock signal input terminal into which the clock signal CLK is inputted and a gate of the n-channel MOS field effect transistor NM1 as the pull-down transistor. A gate of the p-channel MOS field effect transistor PM2 is connected to the output terminal of the latch circuit 1 for receiving the output signal "C" from the latch circuit 1. The n-channel MOS field effect transistor NM2 is connected in series between the ground voltage line and the gate of the n-channel MOS field effect transistor NM1 as the pull-down transistor. A gate of the n-channel MOS field effect transistor NM2 is connected to the output terminal of the latch circuit 1 for receiving the output signal "C" from the latch circuit 1. A second gate control signal is applied to the gate of the n-channel MOS field effect transistor NM1 as the pull-down transistor. The second gate control signal is in the ground level when the n-channel MOS field effect transistor NM2 is in the ON state whilst the p-channel MOS field effect transistor PM2 is in the OFF state. The second gate control signal is in the level according to the clock signal when the n-channel MOS field effect transistor NM2 is in the OFF state whilst the p-channel MOS field effect transistor PM2 is in the ON state.

The following descriptions are concerned with operations of the above pulse generator. The output signal "C" from the latch circuit 1 is risen by rising the action commence signal "AC" and kept in high level until the clock signal level is fallen. When the output signal "C" is the high level, the output signal "P" from the NAND gate 2 is in the low level during the high level of the clock signal CLK. The output signal "P" is inputted into the gate of the p-channel MOS field effect transistor PM1 as the pull-up transistor so that the p-channel MOS field effect transistor PM1 turns ON only when the clock signal is in the high level. When the output signal "C" from the latch circuit 1 is in the high level, the n-channel MOS field effect transistor NM2 is in the ON state whilst the p-channel MOS field effect transistor PM2 is in the OFF state, whereby the ground voltage is applied to the gate of the n-channel MOS field effect transistor NM1 as the pull-down transistor. As a result, when the output signal "C" from the latch circuit 1 is in the high level, the n-channel MOS field effect transistor NM1 as the pull-down transistor is in the OFF state.

When the output signal "C" from the latch circuit 1 is in the low level, the output signal "P" from the NAND gate 2 remains in the high level. Further, the low level output signal "C" is applied to the gates of the p-channel MOS field effect transistor PM2 and the n-channel MOS field effect transistor NM2, whereby the n-channel MOS field effect transistor NM2 is in the OFF state whilst the p-channel MOS field effect transistor PM2 is in the ON state, and the clock signal is applied to the gate of the n-channel MOS field effect transistor NM1 as the pull-down transistor. As a result, when the clock signal CLK is in the high level, the n-channel MOS field effect transistor NM1 as the pull-down transistor is in the ON state.

The NAND gate 2 and the n-channel MOS field effect transistor NM2 prevent that the n-channel MOS field effect transistor NM1 as the pull-down transistor and the p-channel MOS field effect transistor PM1 as the pull-up transistor turn ON concurrently. When the clock signal CLK is in the low level, the n-channel MOS field effect transistor NM1 as the pull-down transistor and the p-channel MOS field effect transistor PM1 as the pull-up transistor are in the OFF state. Notwithstanding, the potential of the pulse signal PG is fixed or held by the invertor circuit comprising the series connection of the two invertors 3-1 and 3-2 in order to prevent the output terminal from entering into the floating state. At the time when the n-channel MOS field effect transistor NM1 as the pull-down transistor turns ON, the p-channel MOS field effect transistor PM1 as the pull-up transistor remains always OFF. At the time when the p-channel MOS field effect transistor PM1 as the pull-up transistor turns ON, the n-channel MOS field effect transistor NM1 as the pull-down transistor remains always OFF. A ratio in threshold voltage of the logic circuit to the invertor circuit comprising the series connection of the inventors 3-1 and 3-2. There is no series connection of n-channel MOS field effect transistors nor series connection of p-channel MOS field effect transistors. This allows the pulse generator to exhibit a high speed output operation of the pulse signal PG.

If the low voltage level of the second gate control signal "N" to be applied to the gate of the n-channel MOS field effect transistor NM1 as the pull-down transistor is not sufficiently low, it is necessary to provide a new n-channel MOS field effect transistor in parallel to the p-channel MOS field effect transistor PM2, wherein an inverted signal to the output signal "C" is applied to the gate of the new n-channel MOS field effect transistor.

Figure 5:
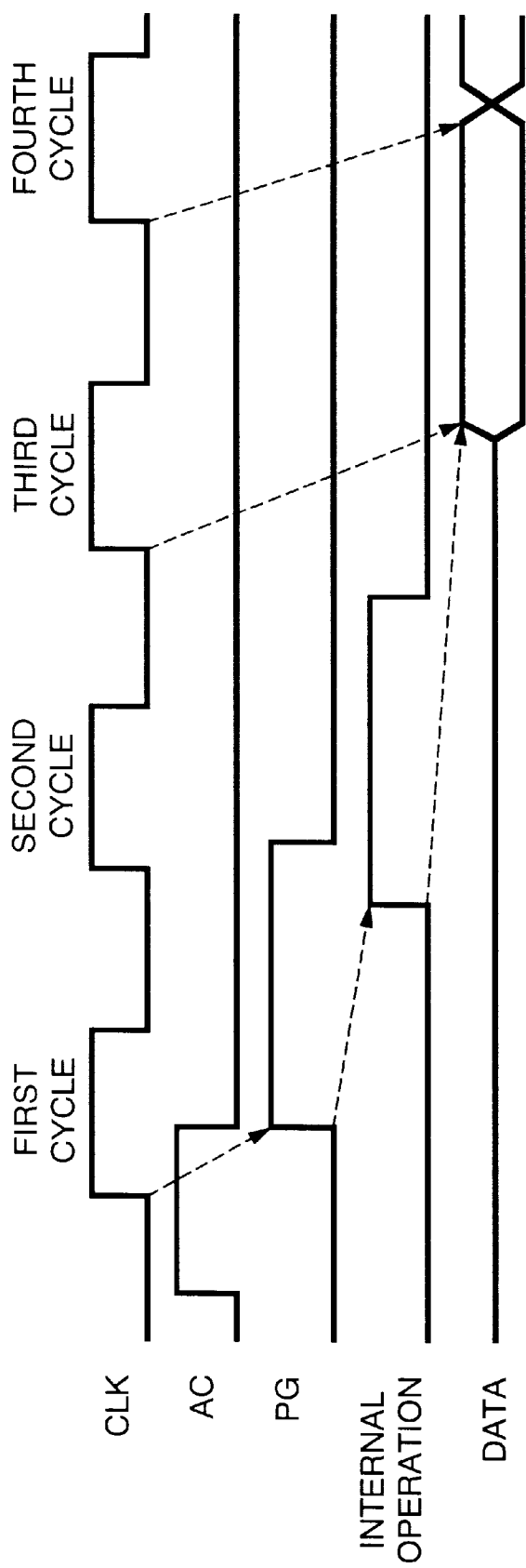
FIG. 5 is a timing chart illustrative of reading operations in latency 2 of a synchronous semiconductor memory device having the pulse generator of FIG. 3.

With reference to FIG. 5, the action commence signal "AC" is given at the high edge or the rising edge of the first cycle of the clock signal, so that the reading operation starts. Thereafter, the basic pulse signal PG is generated by the pulse generator so that an internal memory circuit performs the reading operation in accordance with the basic pulse signal PG generated by the pulse generator. Data are outputted and concurrently fetched into an output resister at the high edge or rising edge of the third cycle of the lock signal CLK. The second cycle is not used on, for which reason the two cycles are used for reading operations of the internal memory.

Accordingly, the novel pulse generator is free from the above problems. The novel pulse generator is capable of generating a high speed pulse. The novel pulse generator is also capable of high speed generation of a pulse signal within a short time from input of a clock signal, for example, within one half of the time necessary for the conventional pulse generator. The novel pulse generator is also capable of a pulse signal having a constant pulse width free of any variation depending upon environmental conditions such as temperature and power voltage level. The novel pulse generator is also capable of a pulse signal having a constant pulse width free of any variation depending upon variation in characteristics of transistors due to variations of manufacturing conditions. The novel pulse generator is also capable of a pulse signal having a constant pulse width entirely depending upon a clock cycle time. The novel pulse generator is operable to avoid concurrent ON-states of pull-up and pull-down transistors. The novel pulse generator is capable of a pulse signal having a constant pulse width entirely depending upon a predetermined time period counted from a pulse rising edge in synchronizing with a clock signal utilizing plural clock cycles as a cycle unit. The novel pulse generator is capable of a pulse signal having a constant pulse width by taking a timing of a pulse falling-edge defined by a delay from a pulse rising-edge. For the above reasons, the synchronous semiconductor memory device can show reading and writing operations activated by a pulse signal generated by the novel pulse generator free from the above problems.

A second embodiment according to the present invention will be described in detail with reference to FIGS. 6 and 7. A difference in circuit configuration of another novel pulse generator of this second embodiment from the above novel pulse generator of this first embodiment is only in further providing an invertor 4 so that the action commence signal "AC" is inputted through the invertor 4 into the latch circuit 1, whereby the latch circuit 1 of this embodiment receives the inversion signal to the action commence signal "AC". The other circuit configuration of this novel pulse generator of this embodiment is the same as that in the first embodiment.

Figure 6:
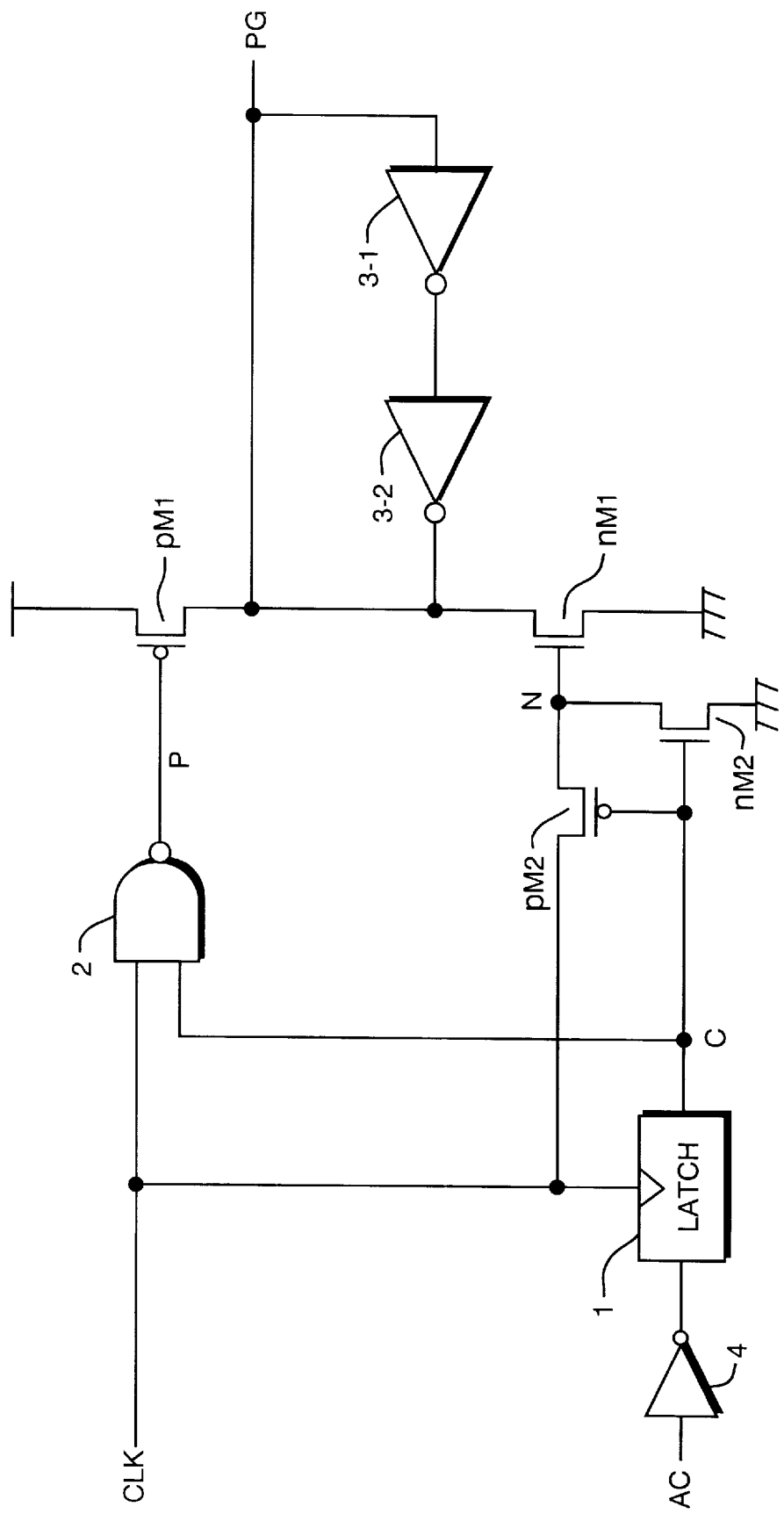
FIG. 6 is a circuit diagram illustrative of a novel pulse generator of a second embodiment in accordance with the present invention.
Figure 7:
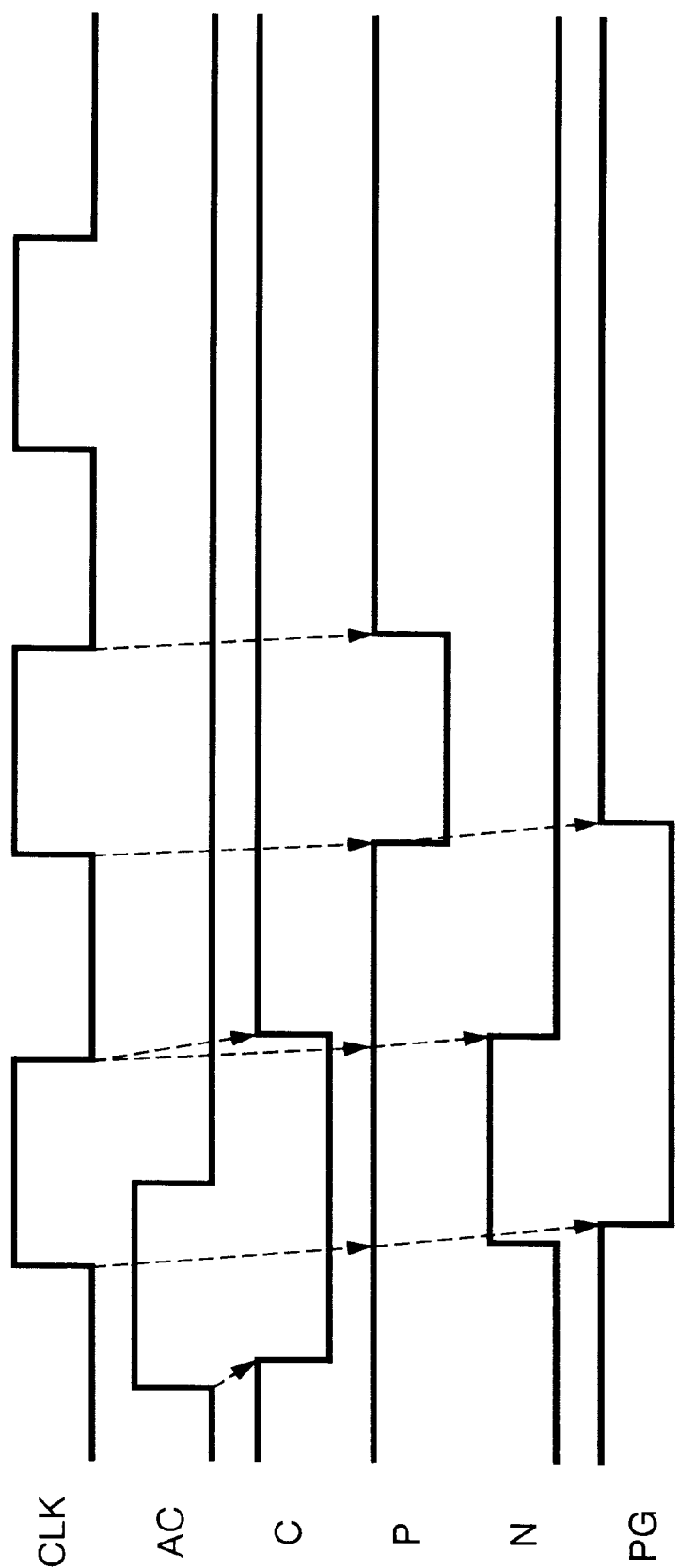
FIG. 7 is a timing chart illustrative of waveforms of signals of a pulse generator of FIG. 6.

As illustrated in FIG. 6, the pule signal PG is low pulse. The relationship of the output signal "C" from the latch circuit 1 to the action commence signal "AC" in this second embodiment is opposite to that that in the first embodiment. The output signal "C" from the latch circuit 1 is in the low level only when the action is commenced. In other times, the output signal "C" from the latch circuit 1 remains high level. Namely, the action commence signal "AC" is inputted through the invertor 4 into the latch circuit 1 for allowing the latch circuit 1 to receive the inversion signal to the action commence signal "AC" so that the output signal "C" from the latch circuit 1 is the inversion signal to the action commence signal "AC" in the first embodiment so that this pulse generator of this second embodiment generates the low pulse signal whilst the above pulse generator in the first embodiment generates the high pulse signal. This circuit configuration allows that the p-channel MOS field effect transistor as the pull-up transistor or the n-channel MOS field effect transistor as the pull-down transistor turns ON depending upon the logic value, for example, high or low level of the output signal "C" from the latch circuit 1 but only in the high level time period of the clock signal CLK. The issue of whether the p-channel MOS field effect transistor as the pull-up transistor turns ON or the n-channel MOS field effect transistor as the pull-down transistor turns ON would entirely depend upon only the logic value, for example, high or low level of the output signal "C" from the latch circuit 1, for which reason the inversion of the voltage level of the pulse signal PG can easily be realized by inverting the output signal "C" from the latch circuit 1.

As a modification to the above circuit configuration, it is possible to provide the invertor 4 at the output side of the latch circuit so that the action commence signal "AC" is directly inputted into the latch circuit 1 and the output signal "C" from the latch circuit 1 is inverted.

The delay in time from the clock signal input timing from the pulse signal generation timing is given by the transfer gate and the n-channel MOS field effect transistor driver buffer. The delay time by the transfer gate is sufficiently small for allowing the single stage logic gate to be considered to start the pulse for improved high speed performances of the pulse generator.

Accordingly, the novel pulse generator is free from the above problems. The novel pulse generator is capable of generating a high speed pulse. The novel pulse generator is also capable of high speed generation of a pulse signal within a short time from input of a clock signal, for example, within one half of the time necessary for the conventional pulse generator. The novel pulse generator is also capable of a pulse signal having a constant pulse width free of any variation depending upon environmental conditions such as temperature and power voltage level. The novel pulse generator is also capable of a pulse signal having a constant pulse width free of any variation depending upon variation in characteristics of transistors due to variations of manufacturing conditions. The novel pulse generator is also capable of a pulse signal having a constant pulse width entirely depending upon a clock cycle time. The novel pulse generator is operable to avoid concurrent ON-states of pull-up and pull-down transistors. The novel pulse generator is capable of a pulse signal having a constant pulse width entirely depending upon a predetermined time period counted from a pulse rising edge in synchronizing with a clock signal utilizing plural clock cycles as a cycle unit. The novel pulse generator is capable of a pulse signal having a constant pulse width by taking a timing of a pulse falling-edge defined by a delay from a pulse rising-edge. For the above reasons, the synchronous semiconductor memory device can show reading and writing operations activated by a pulse signal generated by the novel pulse generator free from the above problems.

Figure 8:
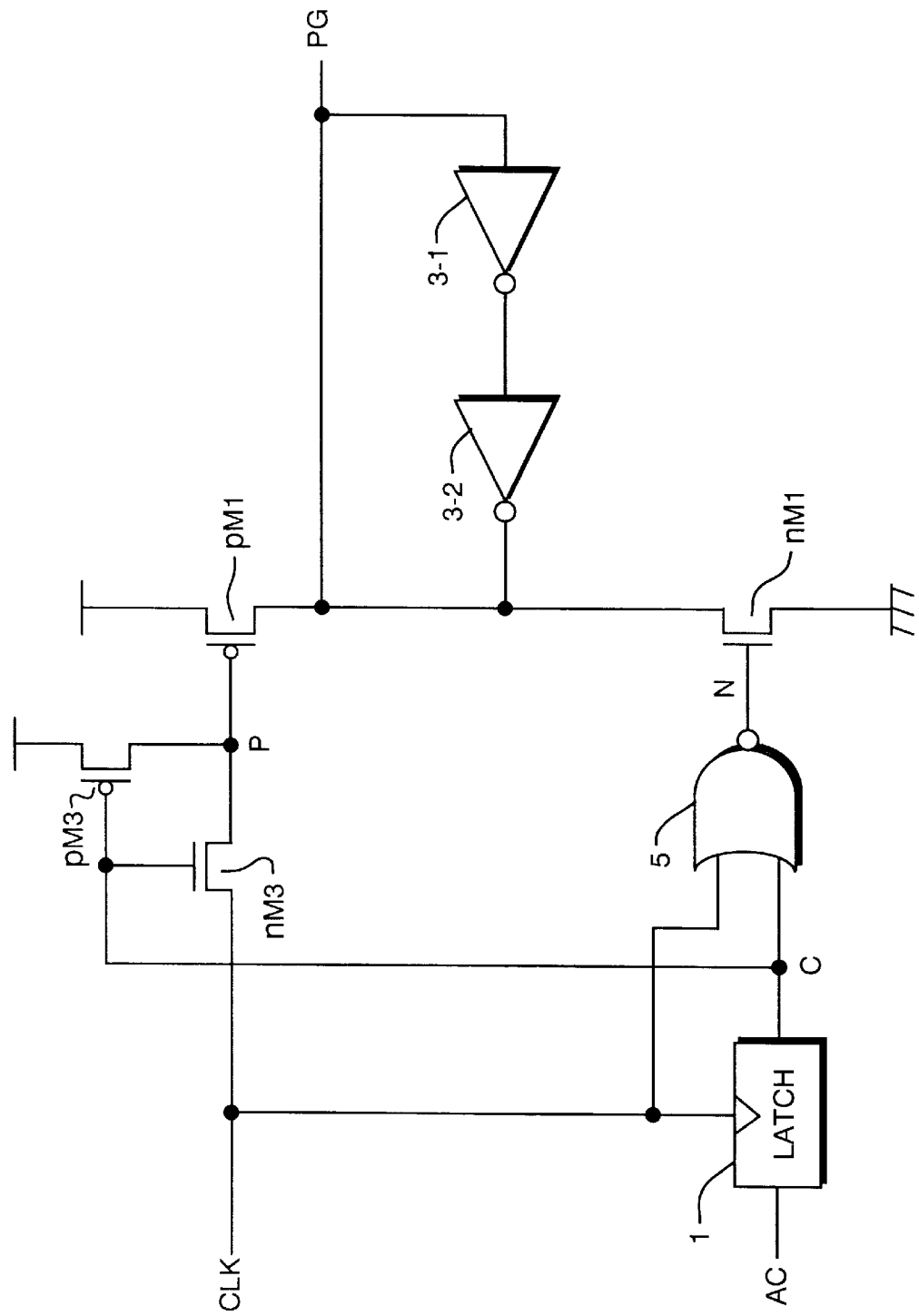
FIG. 8 is a circuit diagram illustrative of a novel pulse generator of a third embodiment in accordance with the present invention.

A third embodiment according to the present invention will be described in detail with reference to FIG. 8. A difference of in circuit configuration of still another novel pulse generator of this third embodiment from the above novel pulse generator of this first embodiment is only in changing or inverting the circuit configuration of the logic circuit for supplying the logic gate signals.

The pulse generator has a first stage having a logic circuit and a second stage having a series connection of pull-up and pull-down transistors between a power voltage line and a ground voltage line. The pull-up transistor comprises a p-channel MOS field effect transistor PM1 connected to the power voltage line. The pull-down transistor comprises an n-channel MOS field effect transistor NM1 connected to the ground voltage line. An intermediate point between the p-channel MOS field effect transistor PM1 and the n-channel MOS field effect transistor NM1 is connected to an output terminal from which a pulse signal PG is outputted. An invertor circuit is further provided between the output terminal and the intermediate point between the p-channel MOS field effect transistor PM1 and the n-channel MOS field effect transistor NM1. The invertor circuit comprises a series connection of a first invertor 3-1 and a second invertor 3-2. The first stage has a latch circuit 1 and a logic circuit.

The latch circuit 1 receives inputs of a clock signal CLK and an action commence signal AC. The latch circuit 1 outputs an output signal "C", wherein the output signal "C" is risen up when the action commence signal AC becomes high level as a burst commence signal, whilst the output signal "C" is fallen down by falling edge of the clock signal CLK. The latch circuit 1 generates the output signal "C" which is the signal obtained by expanding the high level period of the action commence signal AC as the burst commence signal to the low edge or falling edge of the clock signal CLK.

The logic circuit comprises a NOR gate 5 and a p-channel MOS field effect transistor PM3 and an n-channel MOS field effect transistor NM3. The NOR gate 5 has a first input terminal for receiving the clock signal CLK and a second terminal connected to an output terminal of the latch circuit 1 for receiving the output signal "C" from the latch circuit 1. The NOR gate 5 has an output terminal connected to a gate of the n-channel MOS field effect transistor NM1 as the pull-down transistor for sending an output signal "N" as a second gate control signal to the gate of the n-channel MOS field effect transistor NM1. The n-channel MOS field effect transistor NM3 is connected in series between a clock signal input terminal into which the clock signal CLK is inputted and a gate of the p-channel MOS field effect transistor PM1 as the pull-up transistor. A gate of the n-channel MOS field effect transistor NM3 is connected to the output terminal of the latch circuit 1 for receiving the output signal "C" from the latch circuit 1. The p-channel MOS field effect transistor PM3 is connected in series between the power voltage line and the gate of the p-channel MOS field effect transistor PM1 as the pull-up transistor. A gate of the p-channel MOS field effect transistor PM3 is connected to the output terminal of the latch circuit 1 for receiving the output signal "C" from the latch circuit 1. A first gate control signal is applied to the gate of the p-channel MOS field effect transistor PM1 as the pull-up transistor. The first gate control signal "P" is in the power voltage level when the n-channel MOS field effect transistor NM3 is in the OFF state whilst the p-channel MOS field effect transistor PM3 is in the ON state. The second gate control signal "P" is in the level according to the clock signal when the n-channel MOS field effect transistor NM3 is in the ON state whilst the p-channel MOS field effect transistor PM3 is in the OFF state.

In this third embodiments, basic operation timings such as the action commence signal fetching timing of the pulse generator are defined y the low edge or the falling edge of the clock signal CLK. The first gate control signal "P" is inputted through the transfer gate transistor of the n-channel MOS field effect transistor NM3 into the gate of the p-channel MOS field effect transistor PM1 as the pull-up transistor, so that the p-channel MOS field effect transistor PM1 as the pull-up transistor turns ON only when the clock signal CLK is in the low level. The second gate control signal "P" is inputted through the NOR gate 5 into the gate of the n-channel MOS field effect transistor NM1 as the pull-down transistor, so that the n-channel MOS field effect transistor NM1 as the pull-up transistor turns ON only when the clock signal CLK is in the low level.

As a modification to the above pulse generator of this third embodiment, it is possible to provide an invertor at an input side or an output side of the latch circuit as in the second embodiment.

Accordingly, the novel pulse generator is free from the above problems. The novel pulse generator is capable of generating a high speed pulse. The novel pulse generator is also capable of high speed generation of a pulse signal within a short time from input of a clock signal, for example, within one half of the time necessary for the conventional pulse generator. The novel pulse generator is also capable of a pulse signal having a constant pulse width free of any variation depending upon environmental conditions such as temperature and power voltage level. The novel pulse generator is also capable of a pulse signal having a constant pulse width free of any variation depending upon variation in characteristics of transistors due to variations of manufacturing conditions. The novel pulse generator is also capable of a pulse signal having a constant pulse width entirely depending upon a clock cycle time. The novel pulse generator is operable to avoid concurrent ON-states of pull-up and pull-down transistors. The novel pulse generator is capable of a pulse signal having a constant pulse width entirely depending upon a predetermined time period counted from a pulse rising edge in synchronizing with a clock signal utilizing plural clock cycles as a cycle unit The novel pulse generator is capable of a pulse signal having a constant pulse width by taking a timing of a pulse falling-edge defined by a delay from a pulse rising-edge. For the above reasons, the synchronous semiconductor memory device can show reading and writing operations activated by a pulse signal generated by the novel pulse generator free from the above problems.

Figure 9:
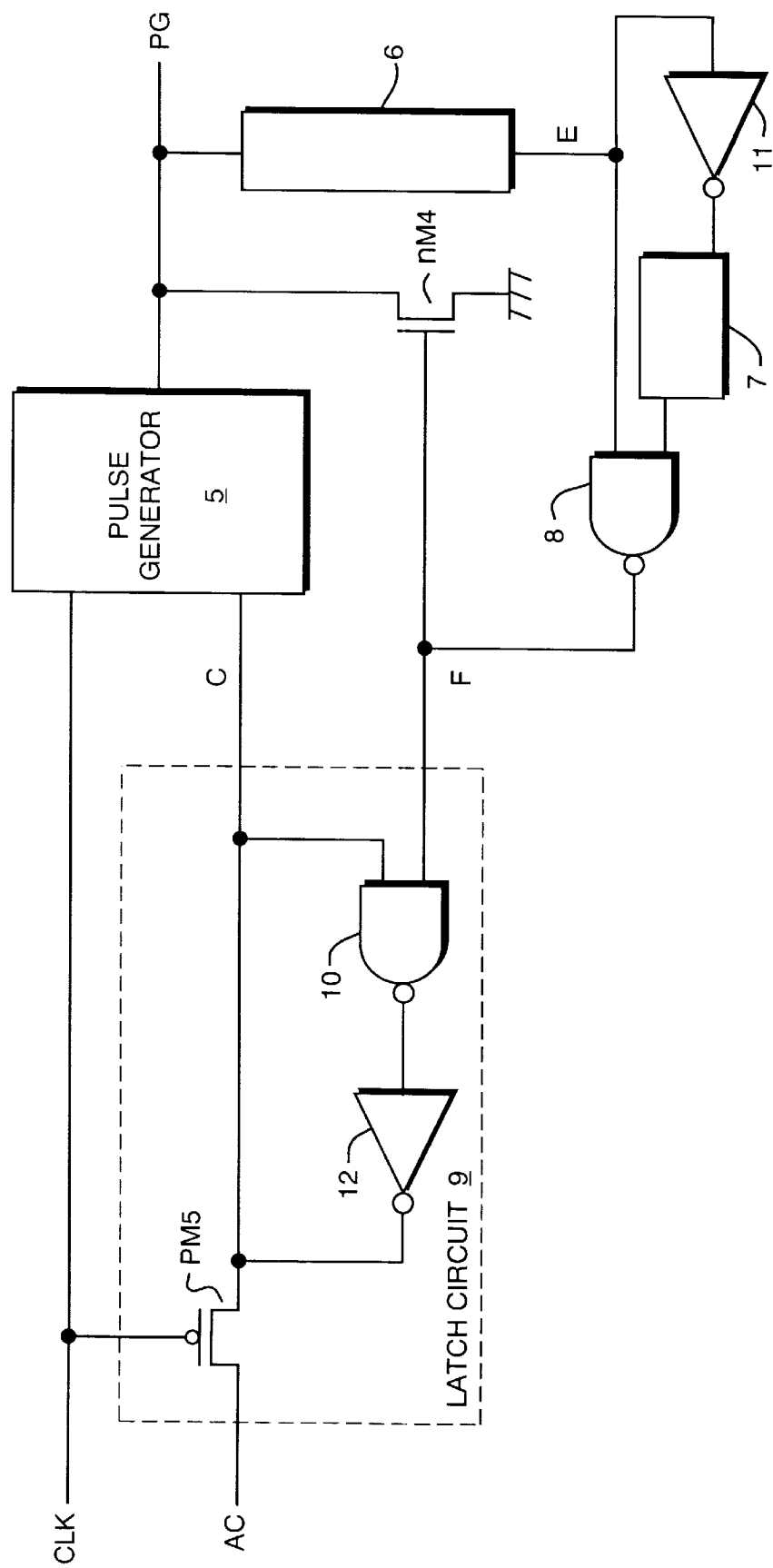
FIG. 9 is a circuit diagram illustrative of a novel pulse generator of a fourth embodiment in accordance with the present invention.

A fourth embodiment according to the present invention will be described in detail with reference to FIG. 9. A difference in circuit configuration of this fourth embodiment from the first embodiment is in further providing a delay circuit and a latch circuit to the above novel pulse signal generator, so that a pulse end timing or a pulse width of the pulse signal PG from the pulse signal generator is defined by a delay time provided by the delay circuit. The pulse start timing of the pulse signal PG is defined by the rising edge or high edge of the lock signal CLK, whilst the pulse end timing of the pulse signal PG is free from the clock signal CLK by defined by the delay time decided by the delay circuit. Namely, the pulse end timing of the pulse signal PG is not defined by the rising or falling edge of the second cycle of the lock signal, for which reason it is unessential to use the tow or more cycles as a cycle unit as in the foregoing embodiments. This circuit configuration is responsible to the requirements for allowing the pulse width to be varied dependent upon variations of the device capabilities or abilities. The pulse generator of this fourth embodiment has a pulse generator 5 having the same circuit configuration as the above novel pulse generator of FIG. 3, however, except for the latch circuit 1 of FIG. 3. The pulse generator of this fourth embodiment has another latch circuit 9 in place of the latch circuit 1 of FIG. 3. The descriptions of the pulse generator 5 will be omitted as being the same circuit configuration as in the first embodiment. A first delay circuit 6 is connected to the output terminal from which the output signal "PG" is outputted so that the first delay circuit 6 receives an input of the output signal "PG" from the pulse generator 5 and then outputs a delay signal "E". An invertor 11 is provided which has an input terminal connected to the output terminal of the delay circuit 6 for receiving the delay signal "E" from the delay circuit 6 and then outputs an inversion signal to the delay signal "E". A second delay circuit 7 is further provided which has an input terminal connected to an output terminal of the invertor 11 for receiving the inversion signal from the invertor 11. A first NAND gate 8 is provided which has a first input terminal connected to the output terminal of the first delay circuit 6 for receiving the first delay signal "E" from the first delay circuit 6 and a second input terminal connected to an output terminal of the second delay circuit 7 for receiving a second delay signal from the second delay circuit 7. The first NAND gate 8 outputs a first logic signal "F". An n-channel MOS field effect transistor NM4 is provided in series between the output terminal of the pule generator 5 and a ground line. A gate of the n-channel MOS field effect transistor NM4 is connected to the output terminal of the first NAND gate 8 for receiving the first logic signal "F" from the first NAND gate 8. Further, a latch circuit 9 is provided which has three input terminals, wherein a first input terminal is connected to the clock signal input terminal into which the clock signal CLK is inputted, a second input terminal is connected to the action commence signal input terminal into which the action commence signal "AC" is inputted, and a third input terminal is connected to the output terminal of the first NAND gate 8 for receiving the first logic signal "F" from the first NAND gate 8. The latch circuit 9 has an output terminal connected to the pulse generator 5 for sending an output signal "C" to the pulse generator 5. The latch circuit 9 comprises a second NAND gate 10, a second invertor 12 and a p-channel MOS field effect transistor PM5. The second NAND gate 10 has a first input terminal connected to the output terminal of the first NAND gate 8 for receiving the first logic output signal "F" from the first NAND gate 8 and a second input terminal connected to an output terminal of the latch circuit from which the output signal "C" is outputted. The second invertor 12 has an input terminal connected to the output terminal of the second NAND gate 10 for receiving an output logic signal from the second NAND gate 10. An output terminal of the second invertor 12 is connected to the output terminal of the latch circuit 9. The p-channel MOS field effect transistor PM5 is connected in series between the action commence signal input terminal into which the action commence signal "AC" is inputted and the output terminal of the latch circuit 9. A gate of the p-channel MOS field effect transistor PM5 is connected to the clock signal input terminal into which the clock signal CLK is inputted for allowing the gate of the p-channel MOS field effect transistor PM5 receives the clock signal CLK.

The output logic signal "F" is inputted into the gate of the n-channel MOS field effect transistor NM4 and concurrently inputted into the first input terminal of the NAND gate 10. When the pulse generator 5 generates the high level pulse signal PG and the voltage level of the output terminal of the pulse generator becomes high, the logic signal "F" as a short high pulse signal is generated with a delay defined by the delay signal generated by the first delay circuit 6. The gate of the n-channel MOS field effect transistor NM4 receives this short high pulse signal, whereby the n-channel MOS field effect transistor NM4 turns ON in a short time period, so that the pulse signal voltage level is dropped to the ground level or low level whereby the high pulse signal is ended. The pulse width of the pulse signal PG is defined by a delay time of the output timing of the delay signal "E" from the start edge of the high pulse signal PG. If the p-channel MOS field effect transistor PM1 as the pull-up transistor in the pulse generator 5 still remains in the ON state even at the timing when the n-channel MOS field effect transistor NM4 should turn ON or in the high level time period of the clock signal CLK, the punch through current may flow due to unstable potential. In order to prevent this punch through current, the logic signal "F" to be inputted into the NAND gate 10 in the latch circuit 9 becomes high level in a short time period, whereby the output signal "C" becomes low level. As a result, the p-channel MOS field effect transistor PM1 turns OFF.

In accordance with this fourth embodiment, it is possible to sustain the superior characteristics of the circuit path and the minimum margin of the high or low pulse width of the clock signal CLK. The pulse generation method is the same as in the first embodiment, whilst the pulse signal end signal is additionally generated in the feed-back system.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A pulse signal generator comprising:
   a series connection of a pull-up transistor and a pull-down transistor between a high voltage line and a low voltage line; and
   a logic circuit having a first input terminal for receiving a clock signal utilizing plural clock cycles as a cycle unit and having a latch circuit for receiving said clock signal and an action commence signal and outputting a latch circuit output signal, said logic circuit having first and second output terminals connected to gates of said pull-up and pull-down transistors for outputting first and second output logic signals from said first and second output terminals and inputting said first and second output logic signals into said gates of said pull-up and pull-down transistors respectively,
   wherein said logic circuit controls ON-OFF operations of said pull-up and pull-down transistors independently, so that said pulse generator generates a start edge of a pulse signal in synchronizing with any one of a rising edge and a falling edge of a first cycle of said clock signal, and then said pulse generator generates an end edge of said pulse signal in synchronizing with any one of a rising edge and a falling edge of a later cycle than said first cycle.

2. The pulse generator as claimed in claim 1, wherein said later cycle than said first cycle is a second cycle.

3. The pulse generator as claimed in claim 2, wherein said logic circuit controls said pull-up and pull-down transistors so that said pull-up transistor turns ON in synchronizing with said any one of said rising edge and said falling edge of said first cycle and then turns OFF in synchronizing with another of said rising edge and said falling edge of said first cycle, before said pull-down transistor turns ON in synchronizing with any one of said rising edge and said failing edge of said second cycle.

4. The pulse generator as claimed in claim 2, wherein said logic circuit controls said pull-up and pull-down transistors so that said pull-down transistor turns ON in synchronizing with said any one of said rising edge and said falling edge of said first cycle and then turns OFF in synchronizing with another of said rising edge and said falling edge of said first cycle, before said pull-up transistor turns ON in synchronizing with any one of said rising edge and said falling, edge of said second cycle.

5. The pulse generator as claimed in claim 1, wherein said logic circuit further comprises:
- a NAND circuit having a first input terminal for receiving said clock signal and a second input terminal for receiving said latch circuit output signal and having a first output terminal connected to said gate of said pull-up transistor;
- an n-channel field effect transistor connected in series between said gate of said pull-down transistor and said low voltage line and said n-channel field effect transistor having a gate receiving said latch circuit output signal; and
- a p-channel field effect transistor connected in series between said first input terminal of said logic circuit and said gate of said pull-down transistor, and said p-channel field effect transistor having a gate receiving said latch circuit output signal.

6. The pulse generator as claimed in claim 5, wherein said logic circuit further comprises an inverter connected to an input side of said latch circuit for inputting said action commence signal through said inverter to said latch circuit.

7. The pulse generator as claimed in claim 1, wherein said logic circuit further comprises:
- a NOR circuit having a first input terminal for receiving said clock signal and a second input terminal for receiving said latch circuit output signal and having a first output terminal connected to said gate of said pull-down transistor;
- a p-channel field effect transistor connected in series between said gate of said pull-up transistor and said high voltage line and said p-channel field effect transistor having a gate receiving said latch circuit output signal; and
- an n-channel field effect transistor connected in series between said first input terminal of said logic circuit and said gate of said pull-up transistor, and said n-channel field effect transistor having a gate receiving said latch circuit output signal.

8. The pulse signal generator as claimed in claim 1, further comprising an inverter circuit connected to an output point positioned intermediate between said pull-up and pull-down transistors for holding an output from said output point when said pull-up and pull-down transistors are in OFF states.

9. The pulse signal generator as claimed in claim 1, wherein said logic gate includes a transfer circuit.

10. A synchronous semiconductor memory device operable in synchronizing with a clock signal utilizing plural clock cycles as a cycle unit, wherein said synchronous semiconductor memory device has a pulse signal generator that includes:
- a series connection of a pull-up transistor and a pull-down transistor between a high voltage line and a low voltage line; and
- a logic circuit having a first input terminal for receiving a clock signal utilizing plural clock cycles as a cycle unit and having a latch circuit for receiving said clock signal and an action commence signal and outputting a latch circuit output signal, said logic circuit having first and second output terminals connected to gates of said pull-up and pull-down transistors for outputting first and second output logic signals from said first and second output terminals and inputting said first and second output logic signals into said gates of said pull-up and pull-down transistors respectively, wherein said logic circuit controls ON-OFF operations of said pull-up and pull-down transistors independently, so that said pulse generator generates a start edge of a pulse signal in synchronizing with any one of a rising edge and a falling edge of a first cycle of said clock signal, and then said pulse generator generates an end edge of said pulse signal in synchronizing with any one of a rising edge and a falling edge of a later cycle than said first cycle.

11. A pulse signal generator comprising:
- a series connection of a pull-up transistor and a pull-down transistor between a high voltage line and a low voltage line; and
- a logic circuit having a first input terminal for receiving a clock signal utilizing plural clock cycles as a cycle unit and having a latch circuit for receiving said clock signal and an action commence signal and outputting a latch circuit output signal, said logic circuit having first and second output terminals connected to gates of said pull-up and pull-down transistors for outputting first and second output logic signals from said first and second output terminals and inputting said first and second output logic signals into said gates of said pull-up and pull-down transistors respectively, wherein said logic circuit controls ON-OFF operations of said pull-up and pull-down transistors independently, so that said pulse generator generates a start edge of a pulse signal in synchronizing with a high level of a first cycle of said clock signal, and then said pulse generator generates an end edge of said pulse signal in synchronizing with a high level of a later cycle than said first cycle.

12. The pulse generator as claimed in claim 11, wherein said later cycle than said first cycle is a second cycle.

13. The pulse generator as claimed in claim 12, wherein said logic circuit controls said pull-up and pull-down transistors so that said pull-up transistor turns ON in synchronizing with said high level of said first cycle and then turns OFF in synchronizing with a low level of said first cycle, before said pull-down transistor turns ON in synchronizing with a high level of said second cycle.

14. The pulse generator as claimed in claim 12, wherein said logic circuit controls said pull-up and pull-down transistors so that said pull-down transistor turns ON in synchronizing with said high level of said first cycle and then turns OFF in synchronizing with a low level of said first cycle, before said pull-up transistor turns ON in synchronizing with a high level of said second cycle.

15. The pulse generator as claimed in claim 11, wherein said logic circuit further comprises:
- a NAND circuit having a first input terminal for receiving said clock signal and a second input terminal for receiving said latch circuit output signal and having a first output terminal connected to said gate of said pull-up transistor;

an n-channel field effect transistor connected in series between said gate of said pull-down transistor and said low voltage line and said n-channel field effect transistor having a gate receiving said latch circuit output signal; and a p-channel field effect transistor connected in series between said first input terminal of said logic circuit and said gate of said pull-down transistor, and said p-channel field effect transistor having a gate receiving said latch circuit output signal.

16. The pulse generator as claimed in claim 15, wherein said logic circuit further compresses an invertor connected to an input side of said latch circuit for inputting said action commence signal through said invertor to said latch circuit.

17. The pulse generator as claimed in claim 11, wherein said logic circuit further comprises:

a NOR circuit having a first input terminal for receiving said clock signal and a second input terminal for receiving said latch circuit output signal and having a first output terminal connected to said gate of said pull-down transistor;

a p-channel field effect transistor connected in series between said gate of said pull-up transistor and said high voltage line and said p-channel field effect transistor having a gate receiving said latch circuit output signal; and an n-channel field effect transistor connected in series between said first input terminal of said logic circuit and said gate of said pull-up transistor, and said n-channel field effect transistor having a gate receiving said latch circuit output signal.

18. The pulse signal generator as claimed in claim 11, further comprising an invertor circuit connected to an output point positioned intermediate between said pull-up and pull-down transistors for holding an output from said output point when said pull-up and pull-down transistors are in OFF states.

19. The pulse signal generator as claimed in claim 11, wherein said logic gate includes a transfer circuit.

20. A synchronous semiconductor memory device operable in synchronizing with a clock signal utilizing plural clock cycles as a cycle unit, wherein said synchronous semiconductor memory device has a pulse signal generator that includes:

a series connection of a pull-up transistor and a pull-down transistor between a high voltage line and a low voltage line; and a logic circuit having a first input terminal for receiving a clock signal utilizing plural clock cycles as a cycle unit and having a latch circuit for receiving said clock signal and an action commence signal and outputting a latch circuit output signal, said logic circuit having first and second output terminals connected to gates of said pull-up and pull-down transistors for outputting first and second output logic signals from said first and second output terminals and inputting said first and second output logic signals into said gates of said pull-up and pull-down transistors respectively, wherein said logic circuit controls ON-OFF operations of said pull-up and pull-down transistors independently, so that said pulse generator generates a start edge of a pulse signal in synchronizing with a high level of a first cycle of said clock signal, and then said pulse generator generates an end edge of said pulse signal in synchronizing with a high level of a later cycle than said first cycle.

21. A pulse signal generator comprising:

a series connection of a pull-up transistor and a pull-down transistor between a high voltage line and a low voltage line, and said pull-up and pull-down transistors being connected to an output terminal of said pulse signal generator;

a logic circuit having a first input terminal for receiving a clock signal, said logic circuit having first and second output terminals connected to gates of said pull-up and pull-down transistors for outputting first and second output logic signals from said first and second output terminals and inputting said first and second output logic signals into said gates of said pull-up and pull-down transistors respectively; and a pulse signal end edge control circuit connected to said output terminal of said pulse signal generator and also connected to said logic circuit, wherein said logic circuit controls ON-OFF operations of said pull-up transistor, so that said pulse generator generates a start edge of said pulse signal in synchronizing with any one of a rising edge and a falling edge of said clock signal, and wherein said pulse signal end edge control circuit controls ON-OFF operations of said pull-down transistor, so that said pulse generator generates an end edge of said pulse signal in synchronizing with any one of a rising edge and a falling edge of a later cycle than a first cycle.

22. The pulse signal generator as claimed in claim 21, wherein said pulse signal end edge control circuit includes at least a delay circuit and at least a logic gate.

23. The pulse signal generator as claimed in claim 22, wherein said pulse signal end edge control circuit comprises:

a first delay circuit having an input side connected to said output terminal of said pulse signal generator;

a first invertor having an input side connected to an output side of said first delay circuit;

a second delay circuit having an input side connected to an output side of said first invertor;

a NAND circuit having a first input terminal connected to said output side of said first delay circuit and a second input terminal connected to an output side of said second delay circuit; and an n-channel field effect transistor connected in series between said output terminal of said pulse signal generator and a low voltage line, and said n-channel field effect transistor having a gate connected to an output terminal of said NAND circuit for receiving an output logic signal from said NAND circuit.

24. The pulse signal generator as claimed in claim 23, further comprising a latch circuit for receiving said clock signal and an action commence signal, said latch circuit connected to said gate of said n-channel field effect transistor for receiving an output signal from said pulse signal end edge control circuit, and said latch circuit further connected to said logic circuit.

25. The pulse signal generator as claimed in claim 24, wherein said latch circuit comprises:

a NAND circuit having a first input terminal connected to said gate of said n-channel field effect transistor of said pulse signal end edge control circuit and a second input terminal connected to said logic circuit;

a second invertor having an input terminal connected to an output terminal of said NAND circuit of said latch circuit and an output terminal connected to said logic gate; and a p-channel field effect transistor connected in series between said logic terminal and an action commence signal terminal to which said action commence signal is inputted, and said p-channel field effect transistor having a gate for receiving said clock signal.

26. The pulse generator as claimed in claim 21, wherein said logic circuit comprises:

a latch circuit for receiving said clock signal and an action commence signal and outputting a latch circuit output signal;

a NAND circuit having a first input terminal for receiving said clock signal and a second input terminal for receiving said latch circuit output signal and having a first output terminal connected to said gate of said pull-up transistor;

an n-channel field effect transistor connected in series between said gate of said pull-down transistor and said low voltage line and said n-channel field effect transistor having a gate receiving said latch circuit output signal; and a p-channel field effect transistor connected in series between said first input terminal of said logic circuit and said gate of said pull-down transistor, and said p-channel field effect transistor having a gate receiving said latch circuit output signal.

27. The pulse generator as claimed in claim 26, wherein said logic circuit further comprises an invertor connected to an input side of said latch circuit for inputting said action commence signal through said invertor to said latch circuit.

28. The pulse generator as claimed in claim 21, wherein said logic circuit comprises:

a latch circuit for receiving said clock signal and an action commence signal and outputting a latch circuit output signal;

a NOR circuit having a first input terminal for receiving said clock signal and a second input terminal for receiving said latch circuit output signal and having a first output terminal connected to said gate of said pull-down transistor;

a p-channel field effect transistor connected in series between said gate of said pull-up transistor and said high voltage line and said p-channel field effect transistor having a gate receiving said latch circuit output signal; and an n-channel field effect transistor connected in series between said first input terminal of said logic circuit and said gate of said pull-up transistor, and said n-channel field effect transistor having a gate receiving said latch circuit output signal.

29. The pulse signal generator as claimed in claim 21, wherein said logic gate includes a transfer circuit.

30. A synchronous semiconductor memory device operable in synchronizing with a clock signal, wherein said synchronous semiconductor memory device has a pulse signal generator that includes:

a series connection of a pull-up transistor and a pull-down transistor between a high voltage line and a low voltage line, and said pull-up and pull-down transistors being connected to an output terminal of said pulse signal generator;

a logic circuit having a first input terminal for receiving a clock signal, said logic circuit having first and second output terminals connected to gates of said pull-up and pull-down transistors for outputting first and second output logic signals from said first and second output terminals and inputting said first and second output logic signals into said gates of said pull-up and pull-down transistors respectively; and a pulse signal end edge control circuit connected to said output terminal of said pulse signal generator and also connected to said logic circuit, wherein said logic circuit controls ON-OFF operations of said pull-up transistor, so that said pulse generator generates a start edge of said pulse signal in synchronizing with any one of a rising edge and a falling edge of said clock signal, and wherein said pulse signal end edge control circuit controls ON-OFF operations of said pull-down transistor, so that said pulse generator generates an end edge of said pulse signal in synchronizing with any one of a rising edge and a falling edge of a later cycle than a first cycle.

31. A pulse signal generator comprising:

a series connection of a pull-up transistor and a pull-down transistor between a high voltage line and a low voltage line, and said pull-up and pull-down transistors being connected to an output terminal of said pulse signal generator;

a logic circuit having a first input terminal for receiving a clock signal, said logic circuit having first and second output terminals connected to gates of said pull-up and pull-down transistors for outputting first and second output logic signals from said first and second output terminals and inputting said first and second output logic signals into said gates of said pull-up and pull-down transistors respectively; and a pulse signal end edge control circuit connected to said output terminal of said pulse signal generator and also connected to said logic circuit, wherein said logic circuit controls ON-OFF operations of said pull-up transistor, so that said pulse generator generates a start edge of said pulse signal in synchronizing with a high level of said clock signal, and wherein said pulse signal end edge control circuit controls ON-OPF operations of said pull-down transistor, so that said pulse generator generates an end edge of said pulse signal in synchronizing with any one of a rising edge and a falling edge of a later cycle than a first cycle.

32. The pulse signal generator as claimed in claim 31, wherein said pulse signal end edge control circuit includes at least a delay circuit and at least a logic gate.

33. The pulse signal generator as claimed in claim 32, wherein said pulse signal end edge control circuit comprises:

a first delay circuit having an input side connected to said output terminal of said pulse signal generator;

a first invertor having an input side connected to an output side of said first delay circuit;

a second delay circuit having an input side connected to an output side of said first invertor;

a NAND circuit having a first input terminal connected to said output side of said first delay circuit and a second input terminal connected to an output side of said second delay circuit; and an n-channel field effect transistor connected in series between said output terminal of said pulse signal generator and a low voltage line, and said n-channel field effect transistor having a gate connected to an output terminal of said NAND circuit for receiving an output logic signal from said NAND circuit.

34. The pulse signal generator as claimed in claim 33, further comprising a latch circuit for receiving said clock signal and an action commence signal, said latch circuit connected to said gate of said n-channel field effect transistor for receiving an output signal from said pulse signal end edge control circuit, and said latch circuit further connected to said logic circuit.

35. The pulse signal generator as claimed in claim 34, wherein said latch circuit comprises:
- a NAND circuit having a first input terminal connected to said gate of said n-channel field effect transistor of said pulse signal end edge control circuit and a second input terminal connected to said logic circuit;
- a second invertor having an input terminal connected to an output terminal of said NAND circuit of said latch circuit and an output terminal connected to said logic gate; and
- a p-channel field effect transistor connected in series between said logic terminal and an action commence signal terminal to which said action commence signal is inputted, and said p-channel field effect transistor having a gate for receiving said clock signal.

36. The pulse generator as claimed in claim 32, wherein said logic circuit comprises:
- a latch circuit for receiving said clock signal and an action commence signal and outputting a latch circuit output signal;
- a NAND circuit having a first input terminal for receiving said clock signal and a second input terminal for receiving said latch circuit output signal and having a first output terminal connected to said gate of said pull-up transistor;
- an n-channel field effect transistor connected in series between said gate of said pull-down transistor and said low voltage line and said n-channel field effect transistor having a gate receiving said latch circuit output signal; and
- a p-channel field effect transistor connected in series between said first input terminal of said logic circuit and said gate of said pull-down transistor, and said p-channel field effect transistor having a gate receiving said latch circuit output signal.

37. The pulse generator as claimed in claim 36, wherein said logic circuit further comprises an invertor connected to an input side of said latch circuit for inputting said action commence signal through said invertor to said latch circuit.

38. The pulse generator as claimed in claim 32, wherein said logic circuit comprises:
- a latch circuit for receiving said clock signal and an action commence signal and outputting a latch circuit output signal;
- a NOR circuit having a first input terminal for receiving said clock signal and a second input termninal for receiving said latch circuit output signal and having a first output terminal connected to said gate of said pull-down transistor;
- a p-channel field effect transistor connected in series between said gate of said pull-up transistor and said high voltage line and said p-channel field effect transistor having a gate receiving said latch circuit output signal; and
- an n-channel field effect transistor connected in series between said first input terminal of said logic circuit and said gate of said pull-up transistor, and said n-channel field effect transistor having a gate receiving said latch circuit output signal.

39. The pulse signal generator as claimed in claim 31, wherein said logic gate includes a transfer circuit.

40. A synchronous semiconductor memory device operable in synchronizing with a clock signal, wherein said synchronous semiconductor memory device has a pulse signal generator that includes:
- a series connection of a pull-up transistor and a pull-down transistor between a high voltage line and a low voltage line, and said pull-up and pull-down transistors being connected to an output terminal of said pulse signal generator;
- a logic circuit having a first input terminal for receiving a clock signal, said logic circuit having first and second output terminals connected to gates of said pull-up and pull-down transistors for outputting first and second output logic signals from said first and second output terminals and inputting said first and second output logic signals into said gates of said pull-up and pull-down transistors respectively; and
- a pulse signal end edge control circuit connected to said output terminal of said pulse signal generator and also connected to said logic circuit,
- wherein said logic circuit controls ON-OFF operations of said pull-up transistor, so that said pulse generator generates a start edge of said pulse signal in synchronizing with a high level of said clock signal, and wherein said pulse signal end edge control circuit controls ON-OFF operations of said pull-down transistor, so that said pulse generator generates an end edge of said pulse signal in synchronizing with any one of a rising edge and a falling edge of a later cycle than a first cycle.

* * * * *